(12) United States Patent
Zhang

(10) Patent No.: US 9,095,052 B2
(45) Date of Patent: Jul. 28, 2015

(54) WIRELESS TERMINAL WITH REDUCED SPECIFIC ABSORPTION RATE PEAK AND IMPLEMENTATION METHOD THEREOF

(75) Inventor: Lu Zhang, Shenzhen (CN)

(73) Assignee: ZTE Corporation, Guangdong (CN)

( * ) Notice: Subject to any disclaimer, the term of this patent is extended or adjusted under 35 U.S.C. 154(b) by 42 days.

(21) Appl. No.: 13/520,908

(22) PCT Filed: Jul. 19, 2010

(86) PCT No.: PCT/CN2010/075256
§ 371 (c)(1),
(2), (4) Date: Jul. 6, 2012

(87) PCT Pub. No.: WO2011/127696
PCT Pub. Date: Oct. 20, 2011

(65) Prior Publication Data
US 2013/0118780 A1    May 16, 2013

(30) Foreign Application Priority Data
Apr. 12, 2010    (CN) .......................... 2010 1 0146501

(51) Int. Cl.
*H04M 1/00*    (2006.01)
*H05K 1/02*    (2006.01)
*H05K 3/00*    (2006.01)

(52) U.S. Cl.
CPC ................ *H05K 1/02* (2013.01); *H05K 1/0224* (2013.01); *H05K 1/0298* (2013.01); *H05K 3/00* (2013.01); *H05K 2201/09145* (2013.01); *H05K 2201/09354* (2013.01)
USPC ........................................ 455/575.5; 174/250

(58) Field of Classification Search
CPC ..... H01Q 1/245; H04B 1/3838; H05K 3/3452
USPC ................ 455/82, 83, 575.5, 575.7, 550.1; 343/700 R, 700 MS, 866, 702; 174/250, 174/255, 256
See application file for complete search history.

(56) References Cited

U.S. PATENT DOCUMENTS 6,104,349 A * 8/2000 Cohen .......................... 343/702
6,127,977 A 10/2000 Cohen
(Continued)

FOREIGN PATENT DOCUMENTS

CN    1574661 A    2/2005
CN    101652034 A    2/2010
(Continued)

OTHER PUBLICATIONS

International Search Report mailed Jan. 13, 2011, as issued in corresponding International Application No. PCT/CN2010/075256, filed Jul. 19, 2010.
(Continued)

*Primary Examiner* — Sonny Trinh
(74) *Attorney, Agent, or Firm* — Maier & Maier, PLLC

(57) ABSTRACT

The disclosure discloses a wireless terminal with a reduced Specific Absorption Rate (SAR) peak. The wireless terminal comprises a Printed Circuit Board (PCB), wherein a fractal gap is formed at an edge of a metal ground on the PCB to disturb distribution of induced current at the edge of the metal ground. The disclosure also discloses a method for reducing an SAR peak. On the premise of the non-influence on the communication quality of the wireless terminal, the SAR and the production cost can be reduced and the structure space of wireless terminal can be saved by using the wireless terminal and the method.

9 Claims, 2 Drawing Sheets

(a)

(b)

(56) References Cited

U.S. PATENT DOCUMENTS

| | | | |
|---|---|---|---|
| 6,603,440 B2* | 8/2003 | Howard | 343/866 |
| 7,245,196 B1 | 7/2007 | Baliarda et al. | |
| 7,280,856 B2* | 10/2007 | Park et al. | 455/575.3 |
| 7,848,771 B2* | 12/2010 | Boyle | 343/702 |
| 7,932,863 B2 | 4/2011 | Pros et al. | 343/702 |
| 8,207,893 B2* | 6/2012 | Baliarda et al. | 343/700 MS |
| 8,253,633 B2* | 8/2012 | Sanz et al. | 343/702 |
| 8,431,826 B2* | 4/2013 | Howard et al. | 174/250 |
| 8,456,365 B2* | 6/2013 | Pros et al. | 343/700 MS |
| 2003/0096637 A1* | 5/2003 | Keller et al. | 455/562 |
| 2004/0046701 A1 | 3/2004 | Huber | |
| 2004/0204027 A1 | 10/2004 | Park | |
| 2006/0139216 A1 | 6/2006 | Glocker et al. | |
| 2007/0205947 A1* | 9/2007 | Boyle | 343/700 MS |
| 2008/0011509 A1 | 1/2008 | Baliarda et al. | |

FOREIGN PATENT DOCUMENTS

| | | | |
|---|---|---|---|
| EP | 1482646 A2 * | 1/2004 | |
| EP | 1482646 A2 | 12/2004 | |
| EP | 2051325 A1 | 4/2009 | |
| JP | 2002246786 A | 8/2002 | |
| JP | 2003520542 A | 7/2003 | |
| JP | 2005184073 A | 7/2005 | |
| JP | 2005538655 A | 12/2005 | |
| JP | 2007194915 A | 8/2007 | |
| KR | 20090014841 A | 2/2009 | |
| WO | 02071534 A1 | 9/2002 | |
| WO | 2006042562 A1 | 4/2006 | |
| WO | WO 2006/042562 A1 * | 4/2006 | H01Q 9/04 |

OTHER PUBLICATIONS

English Translation of the Written Opinion of the International Search Authority mailed Jan. 13, 2011, as issued in corresponding International Application No. PCT/CN2010/075256, filed Jul. 19, 2010.

Saidatul et al., "Multiband fractal planar inverted f antenna (f-pifa) for mobile phone application," Progress in Electromagnetics Research B, vol. 14, 127-148, 2009.

Cabedo et al., "Multiband Handset Antenna Combining a PIFA, Slots, and Ground Plane Modes," IEEE Transactions on Antennas and Propagation, vol. 57, No. 9, pp. 2526-2533, Sep. 2009.

Study and Application of Fractal Antennas in the Multi-frequency Wireless Communication Jan. 20, 2006.

Supplementary European Search Report in European application No. 10849705.8, mailed on Aug. 21, 2014.

* cited by examiner (a)  (b)

(a)  (b)  (c)  (d)

(a) (b) (c)
(d) (e)

WIRELESS TERMINAL WITH REDUCED SPECIFIC ABSORPTION RATE PEAK AND IMPLEMENTATION METHOD THEREOF

RELATED APPLICATIONS

This is the U.S. national stage application which claims priority under 35 U.S.C. §371 to International Patent Application No. PCT/CN2010/075256, filed Jul. 19, 2010, which claims priority to Chinese Patent Application No. 201010146501.2, filed Apr. 12, 2010, the disclosures of which are incorporated by reference herein their entireties.

TECHNICAL FIELD

The disclosure relates to the technology for reducing Specific Absorption Rate (SAR) of wireless terminal, particularly to a wireless terminal with a reduced SAR peak and a method for reducing an SAR peak.

BACKGROUND

With the rapid development of wireless communication technologies, wireless terminals such as mobile terminal or data card receive widespread application; it also can be found that the size of the wireless terminal gets smaller and smaller; while the design difficulty of the wireless terminal structure is increased, another important problem is caused too, that is, electromagnetic radiation of the wireless terminal on a human body is enhanced.

At present, the index to measure the electromagnetic radiation of an antenna on a human body is SAR, which refers to a specific absorption value of the electromagnetic energy of the wireless terminal; the specific implication is that: by the action of external electromagnetic field, an induction electromagnetic field is generated inside a human body; since each organ inside the human body is lossy dielectric, the electromagnetic field inside the human body generates induced current which then causes the human body to absorb and dissipate electromagnetic energy; the SAR is usually used to represent this physical process in biological dosimetry. The implication of SAR refers to the electromagnetic power absorbed or dissipated by human tissue per unit mass, wherein the unit is W/kg or mW/g; the federal communications commission (FCC) of united states definitely regulates the maximum allowed SAR during the interaction of each kind of wireless terminal and a human body; the FCC also regulates that the SAR of the mobile terminal should be measured when the mobile terminal approaches one side of the human brain; the SAR of the data card must be measured on four sides near the data card antenna. Therefore, the point how to meet the electromagnetic radiation standard of the human body while the wireless terminal is miniaturized has become the important problem to be solved immediately.

At present, the wireless terminal SAR attenuation technology, that is, the SAR peak attenuation technology, usually is to coat a wave-absorbing material and/or an anti-radiation layer on the surface of the wireless terminal housing, but the production cost is high; besides, there is a method for setting a conductor reflector and a shielding device in the wireless terminal, thus, during the assembly process of the wireless terminal, it is necessary to provide corresponding location space for the conductor reflector and the shielding device, and more space is occupied; therefore, the original purpose of wireless terminal miniaturization design is violated.

Although both the two solutions above can reduce the SAR, the two solutions have a common defect, that is, after a wave-absorbing material and/or an anti-radiation layer is coated on the surface of the wireless terminal housing, although the coated wave-absorbing material and/or the anti-radiation layer absorbs the electromagnetic wave radiated on the human body by the wireless terminal, the coated wave-absorbing material and/or the anti-radiation layer also absorbs the useful signal radiated outwards in a form of electromagnetic wave by the antenna, thus the communication quality of the wireless terminal is influenced; similarly, although the conductor reflector and the shielding device can isolate the electromagnetic wave radiated on the human body, the conductor reflector and the shielding device also can isolate the signal useful signal radiated outwards by the antenna, thus the communication quality of the wireless terminal is influenced. By the two solutions above, while the SAR of wireless terminal is reduced, the communication performance of the wireless terminal is influenced too, that is to say, the radiation of the near region of the wireless terminal antenna on the human body is reduced, however, the far-field radiation of the antenna is influenced greatly and the wireless terminal can not communicate successfully, thus communication quality can not be guaranteed.

SUMMARY

In view of the problem above, the main object of the disclosure is to provide a wireless terminal with a reduced SAR peak and a method for reducing an SAR peak, which can reduce SAR, reduce production cost and save the structure space of the wireless terminal on the premise of the non-influence on the communication quality of the wireless terminal.

In order to realize the object above, the technical scheme of the disclosure is realized as follows.

The disclosure provides a wireless terminal with a reduced Specific Absorption Rate (SAR) peak, which comprises a Printed Circuit Board (PCB), wherein a fractal gap is formed at an edge of a metal ground on the PCB to disturb distribution of induced current at the edge of the metal ground.

In the solution above, the PCB may have a single-layer or multi-layer structure.

In the solution above, when the PCB has the multi-layer structure, the fractal gap may be formed at any one of the multi-layers, a plurality of layers of the multi-layers, or each of the multi-layers.

In the solution above, the fractal gap may take a geometric shape of Koch normal/random curve, Minkowski curve, L-system tree curve, Serpinski triangular or square gasket, or Serpinski arrow curve.

The disclosure also provides a method for reducing a Specific Absorption Rate (SAR) peak, which comprises: forming a fractal gap at an edge of a metal ground on a Printed Circuit Board (PCB) to disturb distribution of induced current at the edge of the metal ground.

In the solution above, the PCB may have a single-layer or multi-layer structure.

In the solution above, when the PCB has the multi-layer structure, the forming the fractal gap may comprise: forming the fractal gap at any one of the multi-layers, a plurality of layers of the multi-layers, or each of the multi-layers.

In the solution above, the fractal gap may be formed by etching.

In the solution above, the fractal gap may be formed by taking a geometric shape of Koch normal/random curve, Minkowski curve, L-system tree curve, Serpinski triangular or square gasket, or Serpinski arrow curve.

The wireless terminal with a reduced Specific Absorption Rate (SAR) peak and the method for reducing an SAR peak provided by the disclosure is to form a fractal gap at the edge of the metal ground on the PCB, so as to disturb the distribution of the induced current at the edge of the metal ground. Since the fractal set shapes applied by the fractal gap in the disclosure have irregularity and are very complicated, the current direction of the disturbed induced current is random, the phase consistency of each sub-current source is disturbed, and the local electric field extreme value is suppressed, thus the local SAR peak is reduced.

It is known that the radiation feature of the wireless terminal antenna mainly depends on the size relationship between the physical space size of the antenna and the working wavelength of the antenna, but on the geometric shape and the length of the PCB trace; besides, the width of the fractal gap of the disclosure is far less than the working wavelength of the antenna; in view of electromagnetic interference, only if the width of the fractal gap is small enough, the electromagnetic interference of high-frequency signal radiation inside the circuit is not leaked, thus the communication quality of the wireless terminal is guaranteed.

In addition, the forming of fractal gap in the disclosure is mainly completed during the wiring phase of the PCB, without adding extra materials or extra modules; therefore, both cost and space are saved, and the purpose of the wireless terminal miniaturization design is realized.

DETAILED DESCRIPTION

Figure 1:
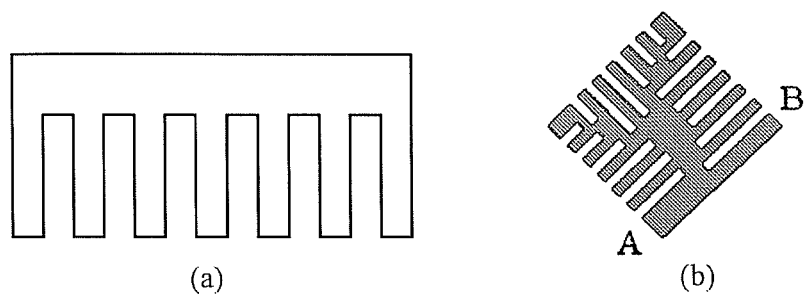
FIG. 1 shows a structure diagram of a pectinate gap at the edge of a metal ground on a present PCB and a diagram of a local fractal gap according to an embodiment of the disclosure.

From the prior art, it can be known that an SAR peak of the wireless terminal is from the joint contribution of surface current of an antenna conductor and surface current induced on a metal surface near the antenna; the research of N. kuster indicates that the SAR peak generally associates with the maximum local induced current on the surface of the metal ground near the antenna or the PCB.

Besides, from the antenna theory, it can be known that the near field of the antenna depends on the radiation superposition of each sub-current source of the induced current; the sub-current source can form a local electric field extreme in case of phase consistency, that is, the SAR peak; based on the current edge effect and proximity effect, it can be obtained that the current on the surface of the PCB generally gathers at the edge of the metal ground, wherein each sub-current source is the small current source forming the induced current; during the research process, people usually split the current into a plurality of sub-current sources; if the phase is consistent when the radiation of each sub-current source is superposed at some point in space, a local electric field extreme is formed.

The concept of fractal is proposed by a French mathematician called Benoit Mandelbrot in the 1970s, the original meaning is irregularity and fragmentation; fractal geometry is a geometry which takes irregular geometric shape as a main study object; all the irregular shapes widely existing in the nature have a feature of fractal; the fractal geometric shape on the whole is irregular everywhere; from the local part, it can be found that the local shape and the whole shape have similarity, that is, the fractal geometric shape has a hierarchical structure of self-similarity and can be generated by iteration process. Since ideal fractal geometric shape has an infinite length in a limited area, the fractal geometric shape has been widely concerned in the design of antenna miniaturization and multi-frequency wideband in recent years. The disclosure will provide a technology for reducing SAR peak in conjunction with the intrinsic mechanism of SAR peak and the fractal geometric shape.

The basic idea of the disclosure is to: a fractal gap is formed at an edge of a metal ground on a PCB to disturb distribution of induced current at the edge of the metal ground.

The fractal gap is formed by etching, and it can be performed during performing wiring of the PCB.

The disclosure is further illustrated below in detail in conjunction with drawings and specific embodiments.

The wireless terminal with a reducing SAR peak provided by the disclosure comprises a PCB, wherein a fractal gap is formed at an edge of a metal ground on the PCB to disturb distribution of induced current at the edge of the metal ground.

The PCB has a single-layer or multi-layer structure, that is, the wireless terminal comprises a single-layer PCB or a multiple-layer PCB; if the PCB has the multi-layer structure, the fractal gap is formed at any one of the multi-layers, a plurality of layers of the multi-layers, or each of the multi-layers.

A method for reducing an SAR peak is realized by: forming a fractal gap at an edge of a metal ground on the PCB;

specifically, the gap in a fractal geometric shape is formed at the edge of the metal ground on the present PCB by etching to disturb distribution of induced current at the edge of the metal ground; that is, to change the phase consistency of each sub-current source of the induced current at the edge of the metal ground on the PCB so as to suppress the generation of local strong electric field and reduce the SAR peak.

Here, since the induced current of the antenna mainly gathers at the edge of the metal ground near an antenna feeding point and a Universal Serial Bus (USB) ground point, the fractal gap can be formed at these locations intensively; that is, the gap in complicated fractal geometric shapes can be formed at these locations, and the gap in simple fractal geometric shapes can be formed at other locations within the edge of the metal ground;

The complexity of the fractal geometric shape is evaluated by the order of the fractal geometric shape; the higher the order is, the higher the complexity of the fractal geometric shape is; contrarily, the lower the order is, the lower the complexity of the fractal geometric shape is.

No gap is formed at the edge of the metal ground on the present PCB, and the induced current flows along straight-line edge of the metal ground on the PCB; FIG. 1 (a) shows a structure diagram of a simple pectinate gap formed at an edge of a metal ground on a present PCB; FIG. 1 (b) shows a local diagram of a fractal gap in a curve shape formed at an edge of a metal ground; as shown in FIG. 1 (b), before forming the fractal gap, the induced current flows along the pectinate gap at the edge of the metal ground on the PCB; after the fractal gap as shown in FIG. 1 (b) is formed, the induced current flows from A/B point to B/A point along the curve line corresponding to the fractal gap.

One side of the line AB closely attaches the inner side edge of the metal ground on the PCB, and the opposite side of the line AB is outwards; in this way, the current direction of the original induced current is changed; due to the irregularity of fractal set shape, the current direction of the induced current is caused to be random, the phase consistency of each sub-current source is disturbed and the local electric field extreme is suppressed, thus local SAR peak is reduced; in addition, since the complexity of the fractal set shape is high, the edge path of the fractal gap is prolonged, the disturbance and the suppression of the induced current is increased, thus local electric field intensity is attenuated.

Figure 2:
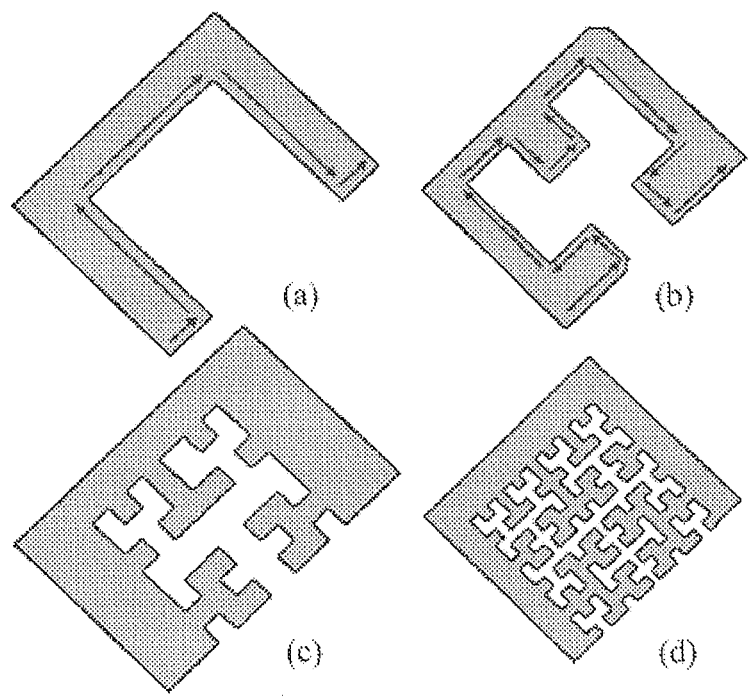
FIG. 2 shows a structure diagram of a fractal gap in the shape of Hilbert curve and a distribution diagram of induced current.

The fractal geometric shape corresponding to the fractal gap in the disclosure has multiple choices; FIG. 2 shows a structure diagram of a fractal gap in the shape of Hilbert curve and a distribution diagram of induced current; as shown in FIG. 2, FIG. 2 (a) is a first-order Hilbert curve; FIG. 2 (b) is a second-order Hilbert curve; arrows in FIG. 2 (a) and FIG. 2 (b) indicate the current direction of the induced current; the pectinate gap at the edge of the metal ground on the present PCB in FIG. 1 can be equivalent to the first-order Hilbert curve; in FIG. 2 it can be obtained that the current direction of the induced current in the corresponding fractal gap is dissipated gradually and the length of the edge through which the induced current flows is increased gradually as the increase of the order of the Hilbert curve; the fractal gap in the shape of the third-order Hilbert curve or the fourth-order Hilbert curve in FIG. 2 (c) and FIG. 2 (d) has made the induced current very complicated, and thus disturbs the phase consistency of each sub-current source of the induced current; therefore, local electric field extreme is reduced effectively and the SAR peak is reduced effectively.

Figure 3:
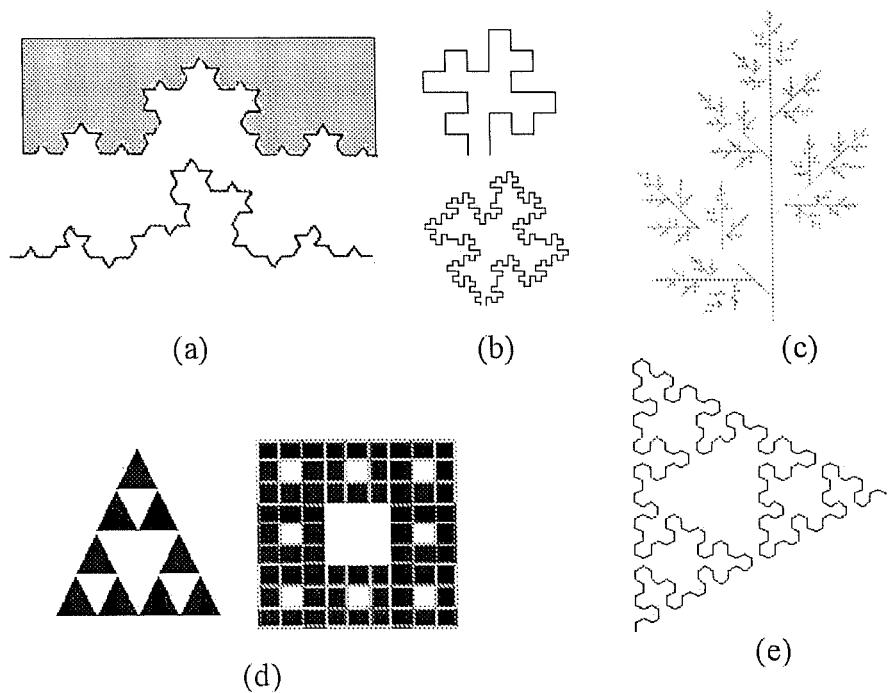
FIG. 3 shows a structure diagram of other fractal geometric shapes corresponding to the fractal gap according to the disclosure.

FIG. 3 shows a structure diagram of other fractal geometric shapes corresponding to the fractal gap according to the disclosure; FIG. 3 (a) shows a third-order Koch normal curve and a third-order Koch random curve, wherein the disturbed induced current flows along the edge of the curve; FIG. 3 (b) shows a Minkowski curve, wherein the disturbed induced current also flows along the edge of the curve; FIG. 3 (c) shows an L-system tree curve, wherein the disturbed induced current flows upwards from a tree root and then back to the tree root along all the branches; in FIG. 3 (c), it can be seen that the current direction of the disturbed induced current is very complicated; FIG. 3 (d) shows a second-order Serpinski triangular and square gasket, the white triangle or square in FIG. 3 (d) indicates hollow patterns etched at the edge of the metal ground, wherein this type of fractal gap can be equivalent to relatively big surface impedance and disturbs the current direction of the original induced current; the phase consistency of each sub-current source is also disturbed; thus, the surface current at the edge of the metal ground on the PCB can be suppressed; FIG. 3 (e) shows a Serpinski arrow curve, wherein the complexity of the disturbed induced current is greatly increased.

In the disclosure, for the wireless terminal in which the PCB has a multi-layer structure, the fractal gap can formed at each of the multi-layers.

The disclosure provides a plurality of optional fractal gaps and the corresponding optional maximum order according to the complexity of the fractal geometric shape and the minimum size limit of the PCB during wiring, as shown in Table 1.

TABLE 1

| Fractal gap | Maximum order |
| --- | --- |
| Hilbert curve | 4 |
| Koch curve | 4 |

TABLE 1-continued

| Fractal gap | Maximum order |
| --- | --- |
| Torn set | 3 |
| Minkowski curve | 2 |
| Mandelbrot curve | 3 |
| Caley tree curve | 3 |
| Sierpinski set | 2 |
| Cantor set | 2 |

Based on the research, the radiation feature of a small-size antenna in a small-size wireless terminal mainly depends on the size relationship between the physical space size of the antenna and the working wavelength of the antenna, but on the geometric shape and the length of the PCB trace, wherein the PCB trace comprises the edge of the metal ground on the PCB; besides, the width of the fractal gap of the disclosure is far less than the working wavelength of the antenna, wherein the width is 1/10 or 1/15 of the working wavelength, even smaller; in view of electromagnetic interference, only if the width of the fractal gap is small enough, the electromagnetic interference of high-frequency signal radiation inside the circuit is not leaked, and the far-field radiation feature of the antenna is not influenced, thus the communication quality of the wireless terminal is guaranteed.

From the above, the technology of forming the fractal gap at the edge of the metal ground on the PCB proposed by the disclosure can effectively reduce the local SAR peak and reduce the harm to a human body without influencing the far-field radiation feature of the wireless terminal antenna; besides, the main job referred in the disclosure is centred in the wiring phase of the PCB, without increasing extra materials or extra modules; therefore, both cost and space are saved; the purpose of realizing wireless terminal miniaturization design is realized.

In addition, the disclosure does not limit the geometric shapes of the fractal gap; Table 1 only lists several common examples; other types of fractal geometric shapes not mentioned in the disclosure or any form of modifications made to the fractal geometric shape of the disclosure are all included in the protection scope of the disclosure.

The above is only the preferred embodiment of the disclosure and not intended to limit the protection scope of the disclosure. Any modification, equivalent substitute and improvement within the spirit and principle of the disclosure are deemed to be included within the protection scope of the disclosure.

What is claimed is:

1. A wireless terminal with a reduced Specific Absorption Rate (SAR) peak, comprising a Printed Circuit Board (PCB), wherein a fractal gap is formed at an edge of a metal ground on the PCB to disturb distribution of induced current at the edge of the metal ground;

wherein the fractal gap takes a geometric shape of at least one of a Koch normal/random curve, a Minkowski curve, an L-system tree curve, a Serpinski triangular or square gasket, or a Serpinski arrow curve.

2. The wireless terminal according to claim 1, wherein the PCB has one of a single-layer or multi-layer structure.

3. The wireless terminal according to claim 2, wherein when the PCB has the multi-layer structure, and the fractal gap is formed at any one layer of the multi-layer structure, a plurality of layers of the multi-layer structure, or each layer of the multi-layer structure.

4. A method for reducing a Specific Absorption Rate (SAR) peak, comprising:

forming a fractal gap at an edge of a metal ground on a Printed Circuit Board (PCB) to disturb distribution of induced current at the edge of the metal ground;

wherein the fractal gap is formed by taking a geometric shape of at least one of a Koch normal/random curve, a Minkowski curve, an L-system tree curve, a Serpinski triangular or square gasket, or a Serpinski arrow curve.

5. The method according to claim 4, wherein the PCB has a one of a single-layer or multi-layer structure.

6. The method according to claim 5, wherein when the PCB has the multi-layer structure, the forming the fractal gap comprises: forming the fractal gap at any one layer of the multi-layer structure, a plurality of layers of the multi-layer structure, or each layer of the multi-layer structure.

7. The method according to claim 5, wherein the fractal gap is formed by etching.

8. The method according to claim 6, wherein the fractal gap is formed by etching.

9. The method according to claim 4, wherein the fractal gap is formed by etching.

* * * * *